(12) United States Patent
Hou et al.

(10) Patent No.: US 12,336,148 B2
(45) Date of Patent: Jun. 17, 2025

(54) THERMAL MANAGEMENT SOLUTION FOR POWER STAGE COMPRISING TOP-COOLED POWER SEMICONDUCTOR SWITCHING DEVICES

(71) Applicant: GaN Systems Inc., Kanata (CA)

(72) Inventors: Ruoyu Hou, Kanata (CA); Juncheng Lu, Kanata (CA)

(73) Assignee: GaN Systems Inc., Kanata (CA)

( * ) Notice: Subject to any disclaimer, the term of this patent is extended or adjusted under 35 U.S.C. 154(b) by 291 days.

(21) Appl. No.: 18/120,046

(22) Filed: Mar. 10, 2023

(65) Prior Publication Data
US 2024/0306348 A1 Sep. 12, 2024

(51) Int. Cl.
*H05K 7/20* (2006.01)
*H01L 23/367* (2006.01)
(Continued)

(52) U.S. Cl.
CPC ..... *H05K 7/20409* (2013.01); *H01L 23/3672* (2013.01); *H05K 1/0216* (2013.01);
(Continued)

(58) Field of Classification Search
CPC .... H05K 7/20; H05K 7/2039; H05K 7/20409; H05K 7/2049; H05K 7/20154; H05K 7/20145; H05K 7/20509; H05K 7/209; H05K 1/0201–0204; H05K 1/0209; H05K 1/0216; H05K 1/185; H05K 2201/066; H05K 2201/10166; H05K 9/00; H01L 23/367; H01L 23/3672; H01L 23/3677; H01L 25/072; H01L 2023/405;
(Continued)

(56) References Cited

U.S. PATENT DOCUMENTS

| 9,589,868 B2 | 3/2017 | McKnight-MacNeil et al. |
| 9,589,869 B2 | 3/2017 | McKnight-MacNeil et al. |

(Continued)

OTHER PUBLICATIONS

Hou, Ruoyu; GaN Systems Inc., "Thermal Management Tips for GaN Transistors", Jul. 14, 2020 (www.gansystems.com); pp. 1-39.
(Continued)

*Primary Examiner* — Amir A Jalali
(74) *Attorney, Agent, or Firm* — Miltons IP/p.i.

(57) ABSTRACT

A power stage assembly for improved thermal dissipation and EMC for top-cooled semiconductor power switching devices, e.g. high voltage, high current lateral GaN power transistors in embedded die packages. The power switching devices are mounted on a PCB substrate, with electrical connections between a bottom side of each device package and the PCB. Each device package has a thermal pad on the top-side. A heat-spreader is secured in thermal contact with the thermal pads of each device, and a heatsink is in thermal contact with the heat-spreader. The heat-spreader is a multilayer structure comprising: a thermally conductive metal substrate layer in contact with the heatsink; a conductive layer providing an EMC layer which is connected to power ground; a conductive layer defining large area thermal pads in thermal contact with thermal pads of each die; and dielectric material electrically isolating conductive layers of the heat-spreader.

17 Claims, 7 Drawing Sheets

(51) Int. Cl.
*H05K 1/02* (2006.01)
*H05K 1/18* (2006.01)

(52) U.S. Cl.
CPC ....... *H05K 1/185* (2013.01); *H05K 2201/066* (2013.01); *H05K 2201/10166* (2013.01)

(58) Field of Classification Search
CPC .... H01L 2023/4062; H01L 2023/4037; H01H 9/52; G06F 1/20
See application file for complete search history.

(56) References Cited

U.S. PATENT DOCUMENTS

| | | | |
|---|---|---|---|
| 9,659,854 B2 | 5/2017 | Klowak et al. | |
| 9,824,949 B2 | 11/2017 | McKnight-MacNeil et al. | |
| 11,062,972 B2 * | 7/2021 | Maier | H01L 23/4334 |
| 11,139,373 B2 | 10/2021 | Mizan et al. | |
| 11,183,440 B2 | 11/2021 | Lu et al. | |
| 2003/0129863 A1 * | 7/2003 | Alcoe | H01L 23/42 |
| | | | 257/E23.087 |
| 2007/0057284 A1 * | 3/2007 | Casey | H01L 23/3675 |
| | | | 438/125 |
| 2013/0083488 A1 * | 4/2013 | Watanabe | H01L 23/4006 |
| | | | 257/E23.083 |
| 2015/0268704 A1 * | 9/2015 | Chiriac | F28F 21/00 |
| | | | 165/185 |
| 2021/0043544 A1 * | 2/2021 | Eid | H03H 9/02102 |
| 2021/0195798 A1 * | 6/2021 | Neal | H01L 23/3675 |
| 2022/0020669 A1 | 1/2022 | McKnight-MacNeil et al. | |
| 2022/0139809 A1 | 5/2022 | Mousavian et al. | |
| 2023/0282540 A1 * | 9/2023 | Hou | H01L 23/3731 |
| | | | 257/712 |
| 2024/0306348 A1 * | 9/2024 | Hou | H05K 1/0216 |

OTHER PUBLICATIONS

GaN Systems Inc.; "High Power IMS Evaluation Platform—Users Guide"; v. Dec. 19, 2017; GSP65RxxHB-EVB 650V; (www.gansystems.com)pp. 1-38.

GaN Systems Inc.; "GaN Systems Releases New High Power Insulated Metal Substrate (IMS) Evaluation Platform", Press Release, Dec. 14, 2017; 2 pages.

Hunter, G.; "IMS (Insulated Metal Substrate) PCBs", PCB Design; Nov. 4, 2014; 5 pages.

ON Semiconductor, Technical Note; TND6031/3; "Introducing Intelligent Power Module (IPM) Family from ON Semiconductor"; Apr. 2014 Rev. 3 (http:/onsemi.com); 8 pages.

\* cited by examiner

Example GaNPx® embedded die packages with bottom-side thermal pad "B-Type"

Example GaNPx® embedded die packages with top-side thermal pad "T-type"

Example: GaNPx bottom-cooled power stage

Example: GaNPx top-cooled power stage

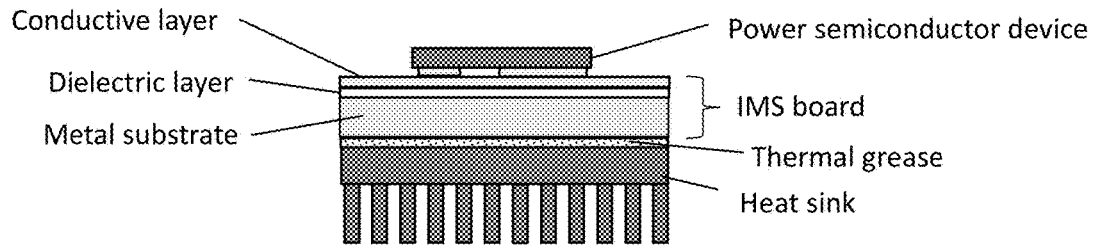
Example: GaNPx bottom-side cooled IMS GaN power stage
Fig. 5 (Prior Art)
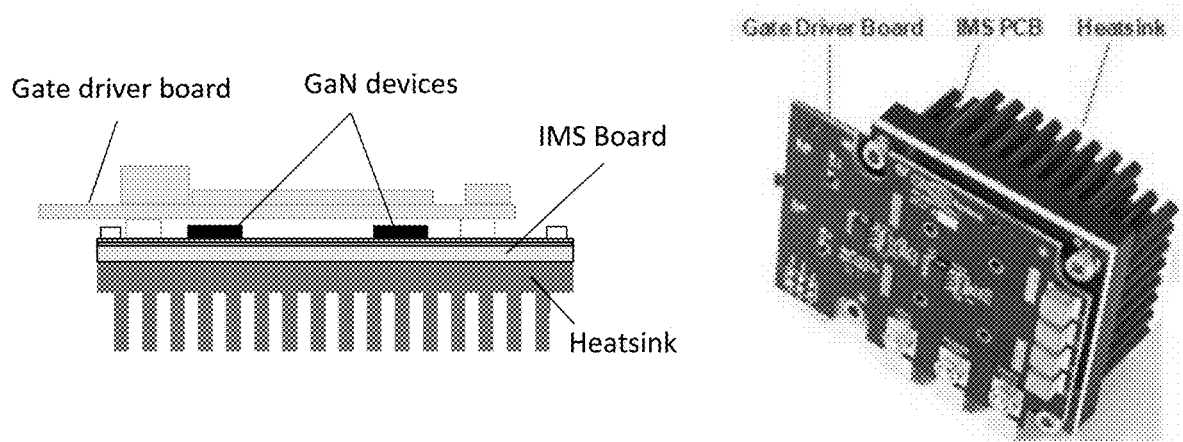
Fig. 6A (Prior Art)
Fig. 6B (Prior Art)
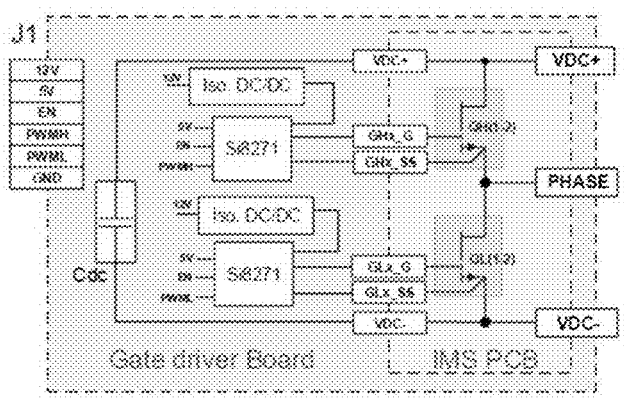
Example driver board layout comprising GaN half-bridge
Fig. 7 (Prior Art)

- Power ground electric potential is connected to 2nd Cu layer thru vias from the 1st Cu layer.

- Thermal pad is internally connected to source
- Low-side device source is connected to power ground (PGND)

Thermal resistance breakdown

|  | Rth(J-C) [C/W] | Rth(C-HS) [C/W] | Rth(J-HS) [C/W] | Rth(HS-A) [C/W] | Overall Rth(J-A) [C/W] |
|---|---|---|---|---|---|
| Top-cool with TIM | 0.35 | 2.55 | 2.9 | 1.5 | 4.4 |
| Top-cool with IMS heatspreader | 0.35 | 1.33 | 1.68 | 1.5 | 3.18 |

By applying top-cool with IMS heatspreader, $R_{th\_JHS}$ thermal improvement is 42%

THERMAL MANAGEMENT SOLUTION FOR POWER STAGE COMPRISING TOP-COOLED POWER SEMICONDUCTOR SWITCHING DEVICES

CROSS-REFERENCE TO RELATED APPLICATION(S)

This application claims the priority of U.S. Provisional Patent Application No. 63/320,314 entitled "THERMAL MANAGEMENT SOLUTION FOR POWER STAGE COMPRISING TOP-COOLED POWER SEMICONDUCTOR SWITCHING DEVICES" and filed on Mar. 16, 2022.

TECHNICAL FIELD

This invention relates to thermal management solutions for power semiconductor switching devices, for example, for power stages or power modules comprising Gallium Nitride (GaN) power transistors for high current/high voltage applications.

BACKGROUND

Power semiconductor switching devices may comprise lateral high electron mobility transistors (HEMTs), such as lateral enhancement-mode (E-mode) HEMTs fabricated with wide-bandgap semiconductor technologies, e.g. III-Nitride based semiconductor materials.

GaN power transistors, such as lateral GaN HEMTs, provide for high current, high voltage operation combined with high switching frequency. For some power applications, GaN power devices and systems offers advantages over silicon technology using Si IGBTs and diodes and silicon carbide (SiC) power transistors and diodes. For example, power switching systems comprising lateral GaN power transistors provide higher efficiency switching, with lower losses, and smaller form factor than comparable systems based on silicon or SiC technology. To benefit from the inherent performance characteristics of lateral GaN transistors, important design considerations include, e.g.: device layout (topology), low inductance interconnect and packaging, and effective thermal management. Lateral GaN power transistors for high current operation at 100V and 650V are currently available from GaN Systems Inc. based on Island Technology® that provides a large gate width $W_g$, low on-resistance, $R_{on}$, and high current capability per unit active area of the device.

Embedded die packaging solutions that offer low inductance interconnections, and low thermal impedance, using either top-side or bottom-side thermal pads, are disclosed, for example, in GaN Systems Inc. earlier filed patent documents and non-patent publications relating to GaNPx® embedded die packaging.

GaN power switching devices offer high current capability, in compact surface mount device (SMD) packaging, such as GaNPx type embedded die packaging. To provide high current capability, power modules or power stage assemblies may comprise multiple GaN transistors mounted on a substrate providing electrical connections, e.g. a power substrate such as a printed circuit board (PCB) or power substrate of a power module on which multiple GaN transistors are connected in parallel and configured to provide high-side and low-side switches of a half-bridge switching topology, or other switching topology. Power substrates may be based, for example, on multilayer PCB technology using FR4-type dielectric layers and copper conductive layers, IMS (Insulated Metal Substrate) technology, or DBC (Direct Bond Copper) technology, A presentation by Ruoyu Hou (Hou), entitled "Thermal Management Tips for GaN Transistors", dated 14 Jul. 2020, provides background information on thermal management design for GaN power switching devices comprising GaN transistors such as e-mode lateral GaN HEMTs using top-cool and bottom-cool designs. For example, because the drain-source on-resistance, $R_{DSon}$, and conduction losses are temperature dependent, and time-to-failure is accelerated at increased junction temperature Tj, good thermal design at both the device level and system level is an important consideration for performance improvement, e.g. reducing overall losses, improving system efficiency and/or improving system reliability.

For example, high current GaN HEMTs having a smaller die size, and smaller embedded die package size, which provides higher power density, and a small area thermal pad, presents challenges for thermal management, particularly to remove heat efficiently from multiple power devices mounted in close proximity on a power substrate. With respect to electro-magnetic compatibility (EMC), since GaN HEMTs operate at higher switching frequencies, EMC is also a design consideration.

There is a need for improved or alternative thermal management solutions for semiconductor power switching devices, such as, power stages comprising GaN power transistors.

SUMMARY OF INVENTION

The present invention seeks to provides improved or alternative thermal management solutions for power switching devices, for example, power stages comprising high current/high voltage GaN power transistors, which mitigate or circumvent at least one of the above-mentioned issues.

One aspect of the invention provides a power stage assembly for top-cooled semiconductor power switching devices comprising:
  a PCB substrate
  a plurality of embedded die packages, each die comprising a semiconductor power switching device comprising at least one power transistor, having source, drain and gate contact areas of the transistors on a front-side of the die and a thermal pad on the back-side of the die;
  the plurality of embedded die packages being mounted on the PCB substrate with electrical connections between the conductive traces of the PCB and source, drain and gate contact areas on the front-side of each die;
  a heat-spreader in thermal contact with the thermal pads on the back-sides of each of each die;
  the heat-spreader being secured to the PCB substrate;
  and a heatsink in thermal contact with the heat-spreader;
  wherein the heat-spreader is a multilayer structure comprising:
    a first layer comprising a thermally conductive metal substrate layer in contact with the heatsink;
    a second layer comprising a thermally conductive dielectric layer;
    a third layer comprising an electrically conductive and thermally conductive material defining an electromagnetic compatibility (EMC) shielding layer;
    a fourth layer comprising a thermally conductive dielectric layer;

a fifth layer comprising an electrically conductive and thermally conductive material defining thermal pads in thermal contact with thermal pads of each die;

the dielectric layers providing electrical isolation between said conductive layers; and the EMC shielding layer being interconnected to power ground; and the thermal pads of the third layer having an area larger than an area of the thermal pad of each embedded die package to provide lateral heat-spreading.

A second aspect of the invention provides a heat-spreader for a power stage assembly configured for a half-bridge switch module, wherein a plurality of the embedded die packages are arranged to provide a high-side switch comprising one power switching device or a plurality of power switching devices connected in parallel and a low-side switch comprising one power switching device or a plurality of power switching devices connected in parallel, the heat-spreader comprising a multilayer insulated metal substrate (IMS) structure comprising:

a first layer comprising a thermally conductive metal substrate layer;

a second layer comprising a thermally conductive dielectric layer;

a third layer comprising an electrically conductive and thermally conductive material defining an electromagnetic compatibility (EMC) shielding layer;

a fourth layer comprising a thermally conductive dielectric layer;

a fifth layer comprising an electrically conductive and thermally conductive material defining thermal pads in thermal contact with thermal pads of each die;

the dielectric layers providing electrical isolation between said conductive layers; and the EMC shielding layer being interconnected to power ground;

the thermal pads of the fifth layer having an area larger than an area of the thermal pad of each embedded die package to provide lateral heat-spreading;

said thermal pads of the fifth layer of the heat-spreader comprising a first thermal pad for the low-side switch and a second thermal pad for the high-side switch, and wherein the first thermal pad is electrically interconnected through the fourth layer to the EMC shielding layer.

Another aspect of the invention provides a power stage assembly for top-cooled semiconductor power switching devices comprising:

a PCB substrate a plurality of embedded die packages, each embedded die package comprising a semiconductor power switching device comprising at least one power transistor, having source, drain and gate contact areas on a bottom-side of the die package and a thermal pad on a top-side of the die package;

the plurality of embedded die packages being mounted on the PCB substrate with electrical connections between conductive traces of the PCB substrate and source, drain and gate contact areas on the bottom-side of each die package;

a heat-spreader in thermal contact with the thermal pads on the back-sides of each of each die;

the heat-spreader being secured to the PCB substrate; and a heatsink in thermal contact with the heat-spreader;

wherein the heat-spreader is a multilayer structure comprising:

a first layer comprising a thermally conductive metal substrate layer in contact with the heatsink;

a second layer comprising a thermally conductive dielectric layer;

a third layer comprising an electrically conductive and thermally conductive material defining thermal pads in contact with a thermal pads on the top-side of each die package;

the dielectric layer providing electrical isolation between the first and second layers of the heat-spreader;

the thermal pads of the third layer having an area larger than an area of the thermal pad of each embedded die package to provide lateral heat-spreading.

For example, power stage assemblies of example embodiments are particularly applicable to III-nitride power switching devices, such as high voltage/high current lateral GaN HEMTs, which provide high current capacity per unit die area and can be packaged in compact embedded die packages which provide high power density and low inductance interconnect.

BRIEF DESCRIPTION OF THE DRAWINGS

FIG. 5 (Prior Art) shows a schematic cross-sectional view of an example of an assembly of a bottom-cooled GaNPx packaged GaN power transistor, wherein the PCB substrate is an IMS PCB, which is mounted on a heatsink;

FIG. 6A (Prior Art) shows schematic a side view of a power stage assembly comprising an IMS PCB, for a GaN half-bridge power switching device comprising bottom-cooled device packages; a heat sink; and a gate driver board mounted over the IMS PCB;

FIG. 6B (Prior Art) shows an oblique view of the power stage assembly of FIG. 6A;

FIG. 7 (Prior Art) shows a schematic block diagram of the GaN half-bridge IMS PCB and gate driver board for the assembly shown in FIGS. 6A and 6B;

The foregoing and other features, aspects and advantages will become more apparent from the following detailed description, taken in conjunction with the accompanying drawings, of example embodiments, which description is by way of example only.

DETAILED DESCRIPTION

Device structures for enhancement-mode (E-mode) lateral GaN power transistors are described, for example, in U.S. Pat. No. 11,139,373, issued Oct. 5, 2021, entitled "Scalable circuit-under-pad device topologies for lateral GaN power transistors", U.S. patent application Ser. No. 17/085,137 filed 30 Oct. 2020, entitled "Device topologies for high current lateral power semiconductor devices", and references cited therein. For example, GaN-on-Silicon devices structures for a GaN HEMT may comprise a silicon substrate, and an epitaxial layer structure (epi-layers) formed on the silicon substrate, comprising a GaN heterostructure, e.g. a GaN barrier layer and an AlGaN channel layer to provide a 2DEG active region. Source, drain and gate contact areas of lateral GaN power transistors are provided on the front-side (may be referred to as the "active side") of the die. The back-side of the die, e.g. a metallization layer on the back-side of the silicon substrate, provides a thermal contact area. While GaN HEMTs may be supplied as a bare die, various forms of embedded die packaging with low inductance interconnect may be provided to allow for either top-side thermal pads or bottom-side thermal pads.

Examples of embedded die packaging for E-mode lateral GaN power transistors is disclosed, for example, in United States patent applications no. U.S. Ser. No. 16/928,305, filed Jul. 14, 2020, entitled "Embedded die packaging for power semiconductor devices"; U.S. Pat. No. 9,659,854, entitled "Embedded Packaging for Devices and Systems Comprising Lateral GaN Power Transistors"; U.S. Pat. No. 9,589,868, entitled "Packaging Solutions for Devices and Systems Comprising Lateral GaN Power Transistors"; and U.S. Pat. No. 9,589,869, entitled "Packaging Solutions for Devices and Systems Comprising Lateral GaN Power Transistors"; U.S. Pat. No. 9,824,949, entitled "Packaging Solutions for Devices and Systems Comprising Lateral GaN Power Transistors".

Figure 1:
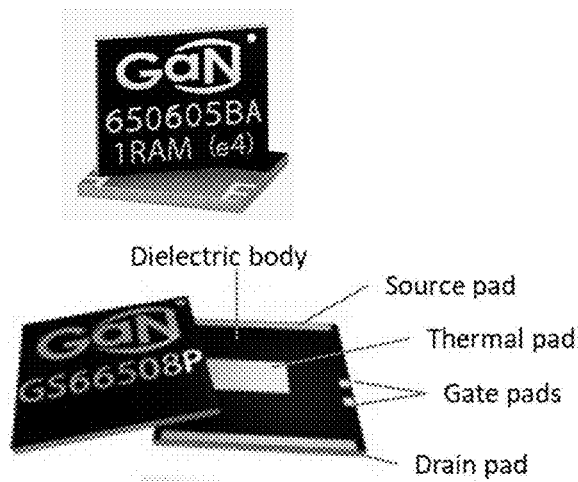
FIG. 1 (Prior Art) shows some examples of GaNPx packaged GaN power transistors with a bottom-side thermal pad.
Figure 2:
FIG. 2 (Prior Art) shows some examples of GaNPx packaged GaN power transistors with a top-side thermal pad.

GaN Systems Inc. GaN$^{Px}$® embedded die packaging can be configured for top-side or bottom-side cooling. For example, FIG. 1 (Prior Art) shows examples of GaNPx packaged GaN power transistors with a bottom-side thermal pad. FIG. 2 (Prior Art) shows examples of GaNPx packaged GaN power transistors with a top-side thermal pad.

Figure 3:
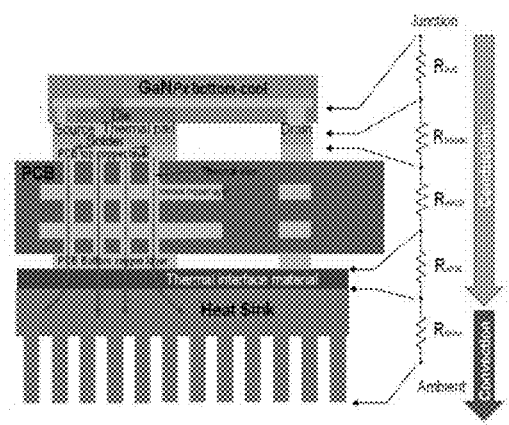
FIG. 3 (Prior Art) shows a schematic cross-sectional view of an example of a bottom-cooled assembly of a GaNPx packaged GaN power transistor and a PCB substrate, and heatsink for thermal management.

FIG. 3 shows a schematic cross-sectional view of an example of a bottom-cooled assembly of a GaNPx packaged GaN power transistor and a PCB substrate, and heatsink for thermal management. In this configuration, the thermal pad and source, drain, and gate contacts are provided on one side of the package. The packaged GaN power transistor is mounted, e.g. by soldering, on a PCB, which provides electrical connections to the source, drain and gate contacts. The thermal pad is in thermal contact with thermal vias which extend through the PCB to a thermal pad on the opposite side of the PCB. A heat sink is mounted in thermal contact, through a layer of thermal interface material (TIM), with the thermal pad of the PCB. FIG. 3 illustrates schematically the thermal resistance of various components which contribute to conductive and convective heat dissipation, which include: the thermal resistance between the junction and the electrical contacts on the die $R_{th}JC$; the thermal resistance of the solder connection between the die contacts and the respective top conductive traces of the PCB, $R_{th}$ solder; the thermal resistance of the PCB $R_{th}PCB$; the thermal resistance of the TIM $R_{th}TIM$; and the thermal resistance of the heatsink to ambient $R_{th}HS\text{-}A$. The overall thermal resistance between the junction and ambient may be referred to as $R_{th}JA$. The junction temperature Tj is dependent on the sum of the ambient temperature $T_A$, the power loss of the GaN HEMT, and the thermal resistance of the heatsink to ambient $R_{th}HS\text{-}A$:

$$Tj = T_A + P \times R_{th}JA$$

The excellent electrical performance Figure of Merit for GaN HEMTs limit the overall power loss. Thermal design to reduce the overall thermal resistance $R_{th}JA$ is importance to optimize device performance, e.g. by reducing Tj to reduce overall conduction and switching losses and improve system reliability.

Figure 4:
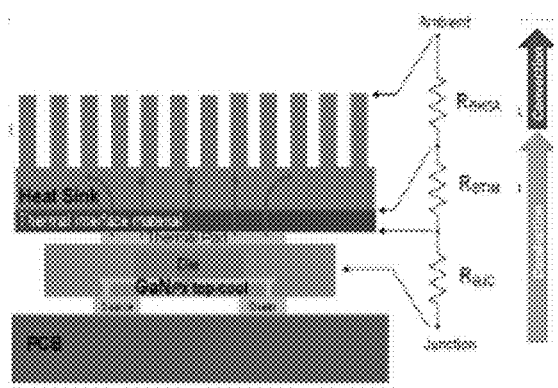
FIG. 4 (Prior Art) shows a schematic cross-sectional view of an example of a top-cooled assembly of a GaNPx packaged GaN power transistor and a PCB substrate, and heatsink for thermal management.

FIG. 4 shows a schematic cross-sectional view of an example of a top-cooled assembly of a GaNPx packaged GaN power transistor and a PCB substrate, and heatsink for thermal management. In a top-cooled embedded die package, the thermal pad is provided on the top side of the package and the electrical contacts for the source, drain and gate are provided on the bottom-side (which corresponds to the active side of the die). In design of a top-cooled assembly, the electrical connections to the PCB are separated from the thermal connections to the heatsink. The overall thermal resistance includes the thermal resistance between the junction and the thermal contact pad on the die $R_{th}JC$; the thermal resistance of the TIM $R_{th}TIM$; and the thermal resistance of the heatsink to ambient $R_{th}HS\text{-}A$.

For a bottom-cooled power assembly, e.g. as illustrated schematically in FIG. 3, where both electrical connections and the thermal pad are on one side of the device, thermal dissipation of power module assemblies comprising FR4 type PCB technology with copper thermal vias, the relatively high thermal resistance of the PCB and solder connections, and TIM, may be a limiting factor. FR4 PCB technology is a mature process, and provides layout flexibility and low cost, but the FR4 dielectrics have relatively high thermal resistance (e.g. 0.25 W/mK).

Thermal resistance for bottom-cooled assemblies can be reduced by using an Insulated Metal Substrate (IMS) PCB, as illustrated in the example shown in FIG. 5. An IMS PCB provides reduced thermal resistance, but on the other hand, IMS PCBs comprise only 1 or 2 layers of electrical connections, and an IMS substrate introduces parasitic inductance and coupling capacitances due to the metal substrate. FIGS. 6A, 6B and 7 show an example of a bottom-cooled IMS power stage assembly for a power semiconductor switching device comprising a half-bridge switch topology, wherein the high-side and low-side switches comprises GaN HEMTs. The assembly comprises an IMS PCB on which the GaN half-bridge is mounted, a heatsink, and a gate driver board which is mounted on the IMS PCB. An example IMS PCB may comprise an isolated aluminum (Al) or copper (Cu) substrate/support layer, a dielectric layer (e.g. 30 μm to 200 μm of a dielectric such as thermal prepreg, having a thermal conductivity in a range of e.g. 1-5 W/mK), and a conductive layer of copper foil (e.g. e.g. 35 μm to 140 μm) which is patterned to provide electrical connections. Use of an IMS PCB and thermal grease between the IMS PCB and the heatsink, as illustrated schematically in FIG. 5, may significantly reduce thermal resistance relative to a conventional FR4 PCB and TIM as illustrated schematically in FIG. 3.

For a top-cooled power assembly, e.g. as illustrated schematically in FIG. 4, with electrical connections on one side of the die, and a thermal pad on other side of the die, the power semiconductor device is sandwiched (e.g. clamped or fastened) between the PCB carrying the electrical connections and the heatsink which contacts the thermal pad on the die. Thermal dissipation for top-cooled power module assemblies is strongly dependent on parameters of the layer of thermal interface material (TIM) provided between the thermal pad and the contact surface of the heatsink. The TIM layer adheres the heatsink to the thermal pad, and provides both thermal contact and electrical isolation, so key parameters of the TIM are thermal conductivity, dielectric strength, mechanical strength, and cost. Other design considerations for top-cooled modules include providing appropriate creepage and clearances distances between the PCB and the heatsink.

Figure 8:
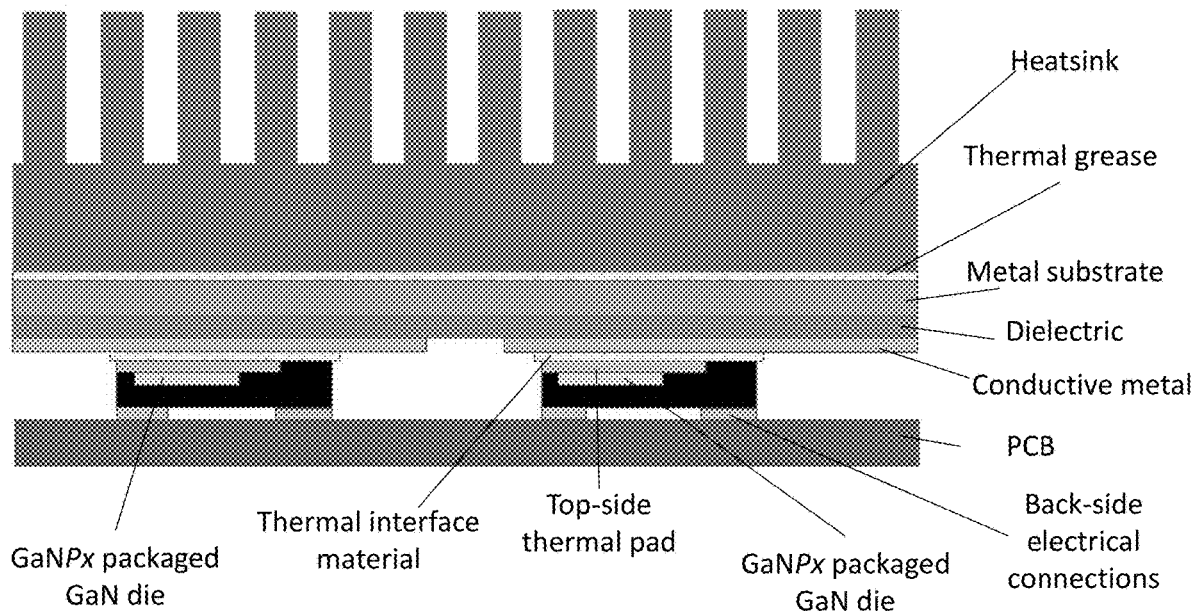
FIG. 8. shows a schematic cross-sectional view of a top-cooled power stage assembly comprising a GaN half-bridge according to a first example embodiment.

A schematic cross-sectional view of a top-cooled power stage assembly of a first example embodiment is shown in FIG. 8. The power stage comprises a half-bridge switch topology, in which the high-side switch and the low-side switch comprise GaN HEMTs mounted on a PCB. For example, the GaN HEMTs are packaged in a GaNPx type embedded die package with a top-side thermal pad, and source, drain and gate contact areas on the back-side, as shown in FIG. 2. As illustrated, by way of example, for the PCB shown in FIG. 9, the PCB layout comprises die attach areas for a high-side switch and a low-side switch, each comprising a single GaN device.

Figures 9, 10, 11:
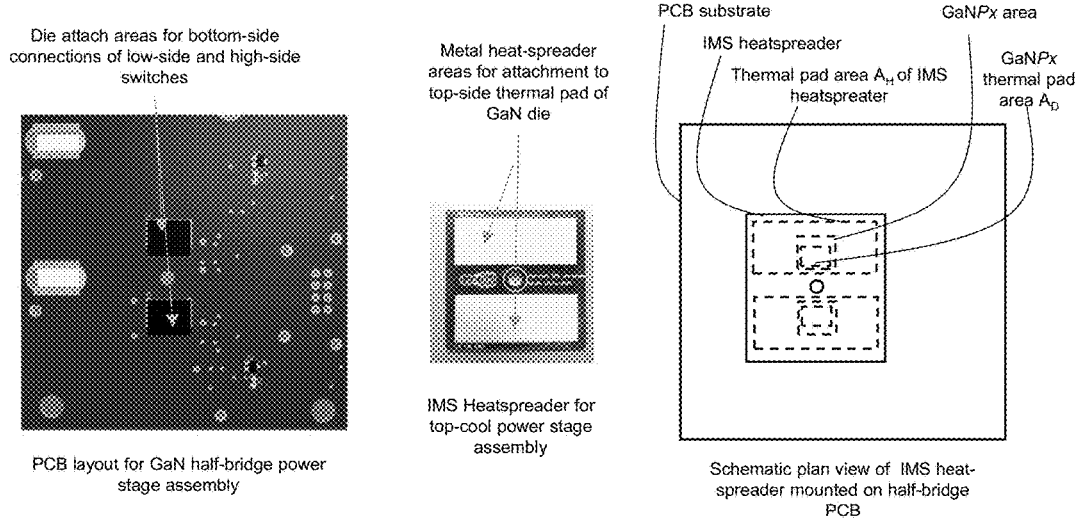
FIG. 9 shows a photo of part of a PCB for a power switching device comprising a GaN half-bridge comprising two GaN power transistors.
FIG. 10 shows a photo of one side of an IMS heat-spreader of the first example embodiment.
FIG. 11 shows a schematic diagram of an overlay of the IMS heat-spreader of the first example embodiment shown in FIG. 10, mounted on the half-bridge PCB shown in FIG. 9.

As shown in the schematic cross-sectional view in FIG. 8, the source, drain and gate contact areas of each GaN HEMT are electrically connected, e.g. soldered, to respective conductive traces on the PCB. The thermal pad on the top-side of the package of each GaN HEMT is in thermal contact with a heat-spreader, which extends laterally over the area of the PCB around the GaN HEMTs. A large area heatsink is in thermal contact with the heat-spreader. The heat-spreader is an IMS heat-spreader, comprising an isolated metal substrate, e.g. a support layer of Al or Cu; a thermally conductive dielectric layer, e.g. a layer of thermal prepreg; and an electrically conductive layer, e.g. a Cu foil layer, which defines first and second thermal pads, as shown in the top plan view in FIG. 10. The thermal pad of each GaN HEMT is in contact with a respective one of the first and second thermal pads of the IMS heat-spreader, with a thermally conductive layer, e.g. thermal grease or other suitable material, between the thermal pad of the package and the thermal pad of the heat-spreader. FIG. 11 shows a schematic top plan view to show alignment of the IMS heat-spreader mounted on the PCB. The IMS heat-spreader has a much large area that the GaN HEMTs. The IMS heat-spreader extends laterally of the GaN HEMTs to provide a lateral thermal path and a large thermal contact area for the heatsink. For example, in an example embodiment, the area AD of thermal pad of a GaNPx embedded die package is ~45 mm² (e.g. 8.2 mm×5.6 mm) and the area AH of each thermal pad on the IMS heat-spreader is ~345 mm² (e.g. 30 mm×11.5 mm) to provide relative areas of $A_H:A_D$ of 7.5:1. The Rth_JHS thermal improvement is 42%.

Figure 12:
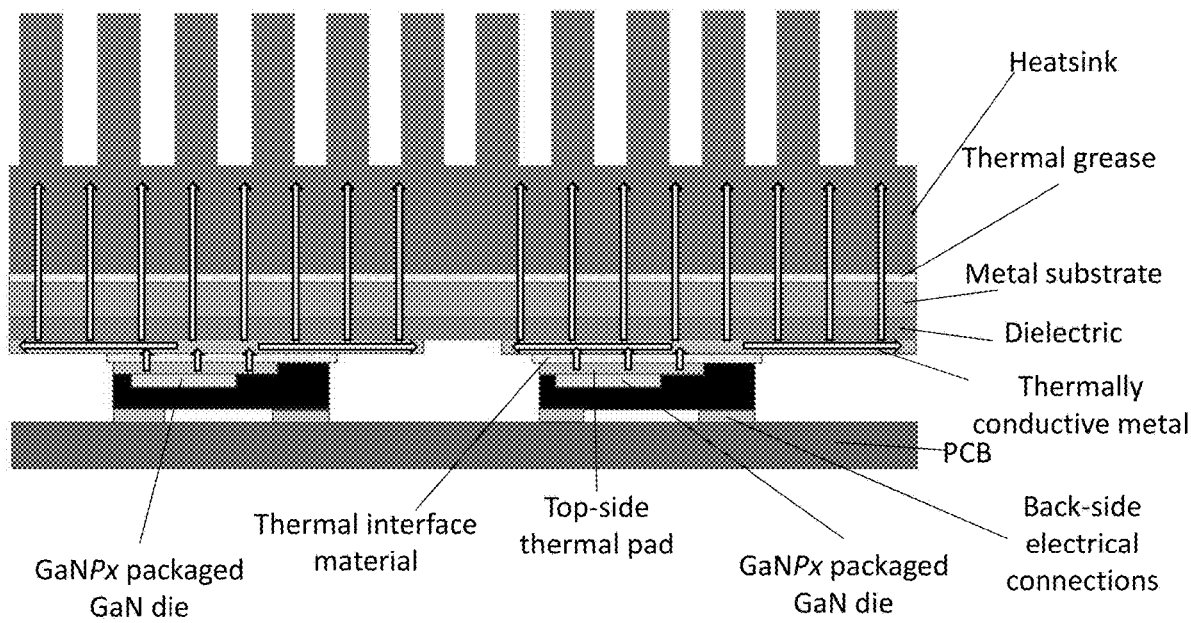
FIG. 12. shows a schematic cross-sectional view of a top-cooled power stage assembly shown in FIG. 8, with arrows to show schematically the thermal path from the die, through the IMS heat-spreader, to the heatsink.

The IMS heat-spreader is secured to the PCB using any suitable mechanical attachment, e.g. one or more screws or clamps to secure the heat-spreader to the PCB with the GaN HEMTs sandwiched between the PCB and the heat-spreader. The heatsink is secured to the IMS heat-spreader with a layer of thermal grease between the heat-spreader and the heatsink. FIG. 12. shows a schematic cross-sectional view of a top-cooled power stage assembly shown in FIG. 8, with arrows added to show schematically the thermal path from the die, through the IMS heat-spreader, to the heatsink. The IMS heat-spreader provides a lateral thermal path to dissipate heat across a greater area of the heatsink.

For simplicity, FIGS. 8 to 12 shows an example power stage assembly with a power substrate PCB configured for half-bridge switch topology, in which each of the high-side switch and the low-side switch is a single GaN power switching device. In alternative embodiments, the power substrate PCB may be configured for a full-bridge switch topology, or other switch topology, wherein high-side and low-side switches comprise GaN power switching devices. For higher current applications, the high-side switch and the low-side switches may each comprise a plurality of GaN HEMTs in parallel to provide higher current capacity. In the latter case, the power substrate PCB would comprise die attach areas for each of the high side and low side switches, and the IMS heatsink would be structured to provide larger thermal contact areas, a first thermal contact area for contact with each of the high-side switches and a second thermal contact area for contact with each of the low-side switches. For some applications the GaN power switching devices are packaged in embedded die packaging such as GaNPx type packaging. For some applications the GaN power switching devices are provided as bare-die.

Figure 13:
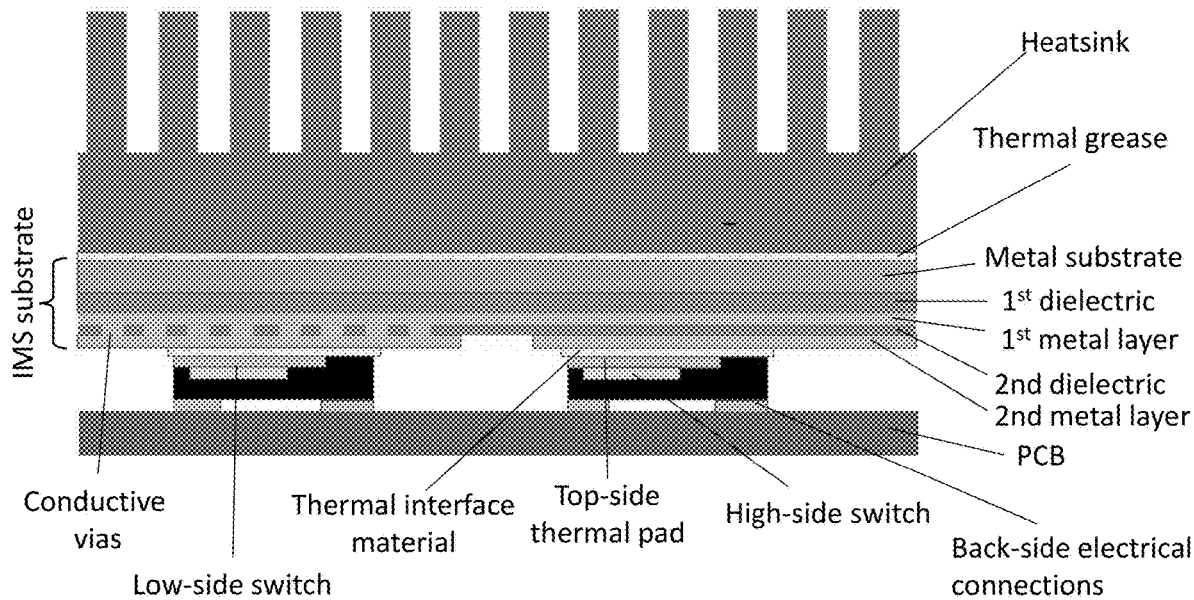
FIG. 13. shows a schematic cross-sectional view of a top-cooled power module assembly of the first according to a second example embodiment.
Figures 14A, 14B:
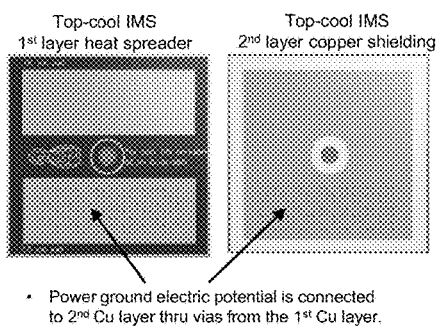
FIG. 14A and FIG. 14B show, respectively, a top view and a bottom view of the IMS heat-spreader of the second example embodiment.
Figure 15:
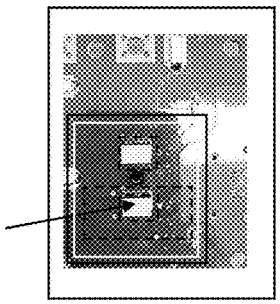
FIG. 15 shows a schematic diagram of an overlay of the half-bridge PCB and the IMS heat-spreader of the second example embodiment.

A schematic cross-sectional view of a top-cooled power stage assembly of a second example embodiment is shown in FIG. 13. The power stage comprises a half-bridge switch topology, in which the high-side switch and the low-side switch comprise GaN power switching devices mounted on a PCB. As illustrated, by way of example, for the PCB shown in FIGS. 10 and 15, the high-side switch and the low-side switch each comprise a single GaN HEMT. For example, the GaN HEMTS are packaged in a GaNPx type embedded die package with a top-side thermal pad, and source, drain and gate contact areas on the back-side as illustrated in FIG. 2. A large area heatsink is in thermal contact with the heat-spreader. The heat-spreader is an IMS heat-spreader, comprising an isolated metal substrate, e.g. a support layer of Al or Cu; a first thermally conductive dielectric layer, e.g. a layer of thermal prepreg; and a first electrically conductive layer e.g. a Cu foil layer; a second thermally conductive dielectric layer, e.g. a layer of thermal prepreg; and a second electrically conductive layer, e.g. a copper foil layer. The second electrically conductive layer defines first and second thermal pads, as shown in the top plan view in FIG. 14A. The first electrically conductive layer defines an EMC shielding layer or plate extending over the area of the first and second thermal pads of the second electrically conductive layer. The first thermal pad, for the low-side switch, is interconnected by conductive vias, e.g. an array of laser drilled Cu filled vias, to the first conductive layer defining the EMC shielding layer. Thus, the source of the low-side device, which is connected to power ground (PGND), is connected to the EMC shielding plate defined by the first conductive layer. The thermal pad of each GaN HEMT is in contact with a respective one of the first and second thermal pads of the IMS heat-spreader, with a thermally conductive layer, e.g. thermal grease or other suitable material, between the thermal pad of the package and the thermal pad of the heat-spreader. The IMS heat-spreader extends laterally of the GaN HEMTs to provide a lateral thermal path and a large thermal contact area for the heatsink. The IMS heat-spreader is secured to the PCB using any suitable mechanical attachment, e.g. one or more fasteners or clamps to secure the heat-spreader to the PCB with the GaN HEMTs sandwiched between the PCB and the heat-spreader. The heatsink is secured to the IMS heat-spreader with a layer of thermal grease between the heat-spreader and the heatsink.

Figures 16, 17:
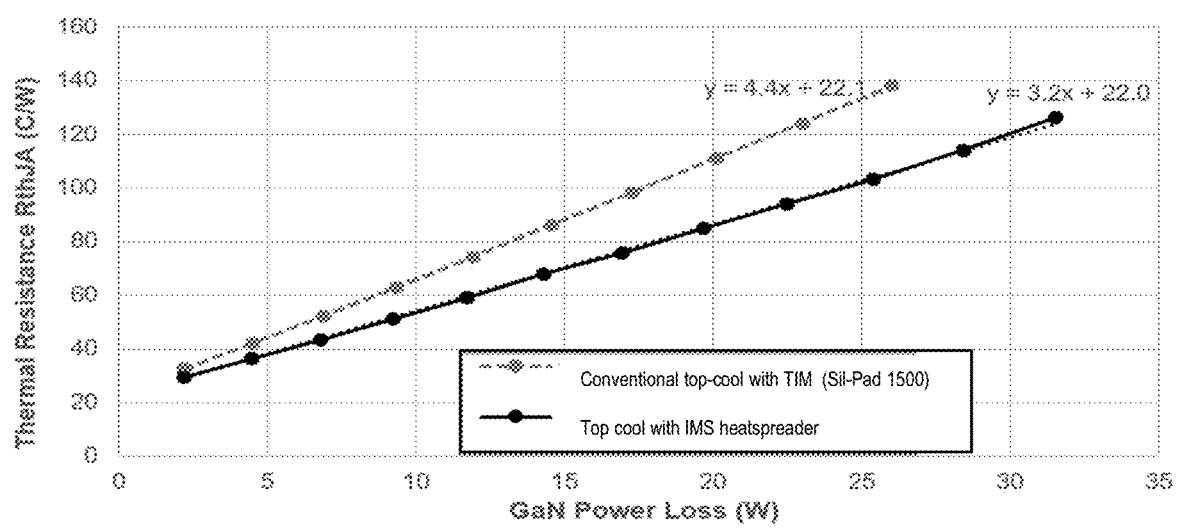
FIG. 16 shows a table of data showing elements of thermal resistance for an example conventional top-cooled power assembly comprising TIM and a top-cooled power assembly of an example embodiment comprising an IMS heat-spreader (single layer) for an example GaN half-bridge power switching device.
FIG. 17 shows a plot comparing of the overall thermal resistance RthJA (C/W) vs. GaN power loss (W) for the example half-bridge power switching device with conventional top-cooled power assembly comprising TIM and the top-cooled power assembly of the example embodiment comprising an IMS heat-spreader (single layer)

The data table in FIG. 16 compares elements of thermal resistance for an example conventional top-cooled power assembly comprising a TIM layer between the thermal pad of the GaN device and the heatsink; and a top-cooled power assembly of an example embodiment, comprising an IMS heat-spreader between the GaN device and the heatsink. The heatsink is the same size for both examples. In this embodiment, the IMS heat-spreader has a single copper layer. The IMS heat-spreader has a significantly reduced thermal resistance relative to a conventional TIM layer. In this example embodiment, the thermal resistance between the junction and heatsink is reduced from 2.9 C/W to 1.68 C/W, a reduction of 42%.

FIG. 17 shows a plot comparing of the overall thermal resistance $R_{th}JA$ (C/W) vs. GaN power loss (W) for the example half-bridge power switching device with conventional top-cooled power assembly comprising TIM and the top-cooled power assembly of the example embodiment comprising an IMS heat-spreader with a single copper layer.

Figure 18:
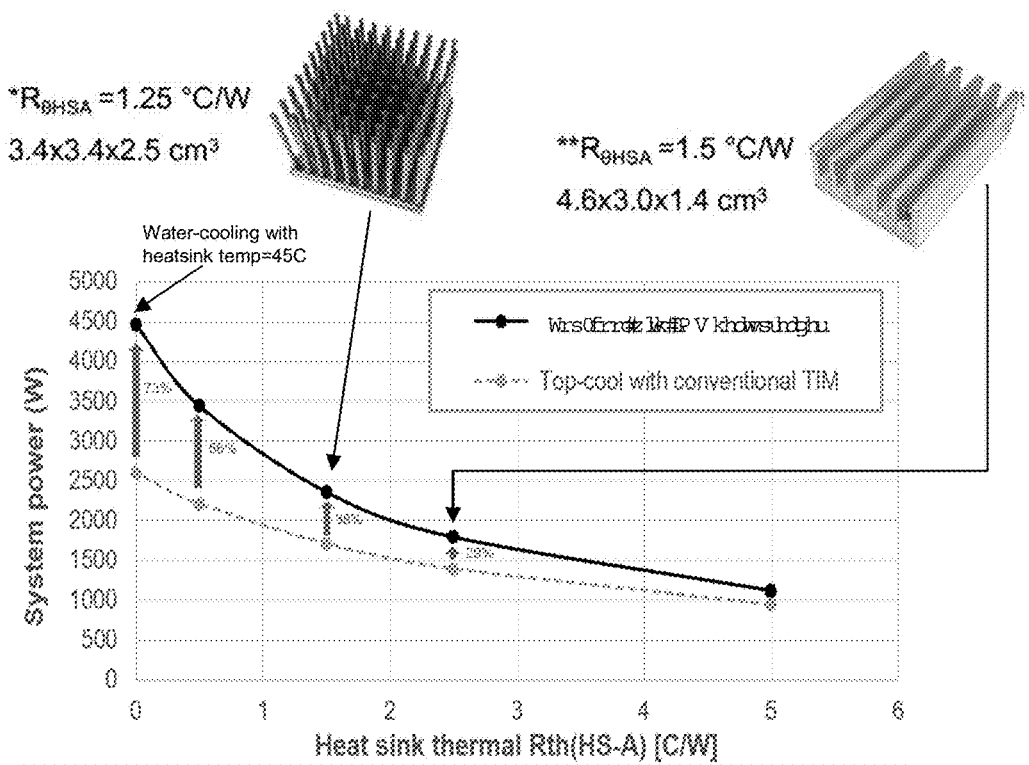
FIG. 18 shows a plot comparing of the system power (W) vs. heat sink thermal resistance $R_{th}HS\text{-}A$ (C/W) for the example half-bridge power switching device with a conventional top-cooled power assembly comprising TIM and the top-cooled power assembly of the example embodiment comprising an IMS heat-spreader (single layer)

FIG. 18 shows a plot comparing of the system power (W) vs. heat sink thermal resistance $R_{th}HS\text{-}A$ (C/W) for the example half-bridge power switching device with a conventional top-cooled power assembly comprising TIM and the top-cooled power assembly of the example embodiment comprising an IMS heat-spreader, for different types of heatsink.

Figure 19:
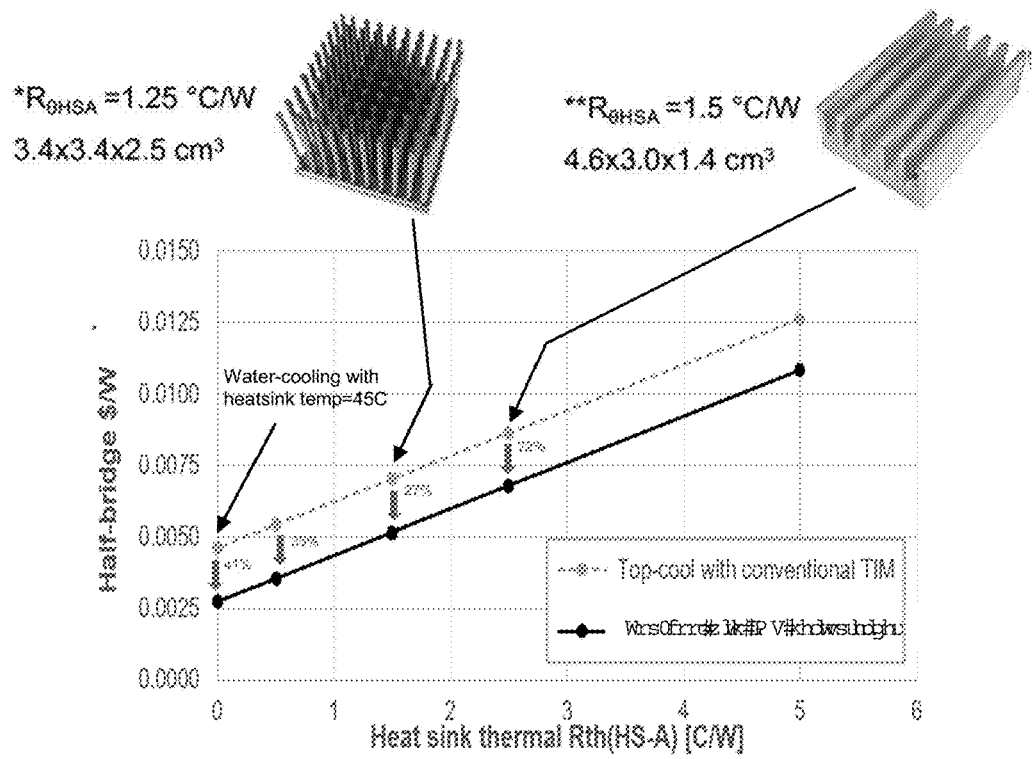
FIG. 19 shows a plot comparing of the dollar per Watt cost ($/W) vs. heat sink thermal resistance $R_{th}HS\text{-}A$ (C/W) for the example half-bridge power switching device with a conventional top-cooled power assembly comprising TIM and the top-cooled power assembly of the example embodiment comprising an IMS heat-spreader (single layer).

FIG. 19 shows a plot comparing of the dollar per Watt cost ($/W) vs. heat sink thermal resistance $R_{th}HS\text{-}A$ (C/W) for the example half-bridge power switching device with a conventional top-cooled power assembly comprising TIM and the top-cooled power assembly of the example embodiment comprising an IMS heat-spreader with a single copper layer, for different types of heatsink.

Top-cooled assemblies for power switching stages comprising GaN power transistors of example embodiments have been described which comprises IMS heat-spreaders for reduced thermal resistance and improved thermal dissipation. In some embodiments, the IMS heat-spreader provides an additional conductive shielding layer for enhanced EMC performance.

In alternative embodiments, the IMS heat-spreader could be replaced by a heat-spreader formed by DBC (Direct Bond Copper) substrate or an AMB (Active Metal Brazed) substrate.

Other suitable heat-spreader structures comprise a support substrate comprising at least one layer which is thermally conductive and provides electrical isolation, and at least one conductive layer defining thermal pads for each power semiconductor device, and optionally a second conductive layer to provide an EMC shielding layer. Thermal pads of the heat-spreader which are in contact with the top-side thermal pad of each power switching device have a large area compared to the area of the thermal pad of the packaged device. The thermal pad therefore provides horizontal or lateral heat-spreading before electrical isolation. Inserting the heat-spreader between thermal pads of the power semiconductor devices and the heatsink provides a lateral thermal path of lower thermal resistance.

An IMS substrate having first and second conductive layers provides a structure in which the one conductive layer provided thermal pads for lateral heat-spreading and the other conductive layer provides an EMC shielding layer.

Top-cool devices are useful for power electronic designs, because when there is no overlapping of the thermal and electrical layers, there is more flexibility for PCB layout of the power substrate, and improved flexibility on system/heatsink design and installation for both high-power and low-power applications.

A barrier to further improve top-cool device thermal performance is limited area of the thermal pad area/size of the device. With a smaller die size, and a smaller package, thermal performance is limited by the area of the thermal pad. On the other hand, in larger sized package, parasitics, such as interconnect inductance or resistance may limit performance of power semiconductor devices like GaN HEMTs, which are capable of fast switching speeds (fast turn-on and turn-off times, and operation at higher switching frequencies).

In power stage assemblies of example embodiments disclosed herein, significant enhancement of the thermal performance of a top-cooled device is achieved, while maintain a good switching performance and EMC performance, which contributes to improving the $/W on system level.

While power stage assemblies of example embodiments have been described in detail with reference to semiconductor power switching devices comprising lateral GaN transistors, such as a high voltage/high current GaN HEMTs, wherein active layers comprise GaN/AlGaN hetero-layer structures, it will be apparent that nitride semiconductor device structures according to alternative embodiments may comprise lateral GaN power transistors and/or diodes. More generally, a nitride semiconductor device comprises a III-nitride semiconductor, that is, a compound semiconductor which includes nitrogen and at least one group III element, such as GaN, AlGaN, AlN, InGaN, InAlGaN, and the nitride semiconductor device structure comprises a hetero-layer structure comprising first and second nitride semiconductor layers of different bandgaps, that forms an active region comprising a two-dimensional electron gas (2DEG) region for transistors and/or diodes.

Power stage assemblies providing improved top-side cooling and EMC performance, as disclosed herein for GaN power switching devices, may be applicable more generally to power switching devices fabricated using other semiconductor technologies where it is required to provide top-side cooling.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A power stage assembly for top-cooled semiconductor power switching devices comprising:
a PCB substrate
a plurality of embedded die packages, each die package comprising a semiconductor power switching device comprising at least one power transistor, having electrical contact areas on a front-side of the embedded die package and a thermal pad on the back side of the embedded die package;
the plurality of embedded die packages being mounted on the PCB substrate with electrical connections between conductive traces of the PCB and the electrical contact areas on the front-side of each die package;
a heat-spreader in thermal contact with the thermal pads on the back-side of each die package; the heat-spreader being secured to the PCB substrate; and a heatsink in thermal contact with the heat-spreader;
wherein the heat-spreader is a multilayer structure comprising:
a first layer comprising a thermally conductive metal substrate layer in contact with the heatsink;
a second layer comprising a thermally conductive dielectric layer;
a third layer comprising an electrically conductive and thermally conductive material defining an electromagnetic compatibility (EMC) shielding layer;
a fourth layer comprising a thermally conductive dielectric layer;
a fifth layer comprising an electrically conductive and thermally conductive material defining thermal pads in thermal contact with thermal pads of each die package;
the dielectric layers providing electrical isolation between said conductive layers; and the EMC shielding layer being interconnected to power ground; and the thermal pads of the fifth layer having an area larger than an area of the thermal pad of each embedded die package to provide lateral heat-spreading.

2. The power stage assembly of claim 1, wherein said layers of the heat-spreader are provided by a multi-layer insulated metal substrate (IMS).

3. The power stage assembly of claim 1, wherein the top-cooled power switching devices are GaN power switching devices.

4. The power stage assembly of claim 1, configured for a half-bridge switch topology, a full-bridge switch topology, or other switch topology comprising a plurality of power switching devices.

5. The power stage assembly of claim 1, wherein the thermal pads of the embedded die packages have an area $A_D$ and the thermal pads of the heat-spreader have an area $A_H$, and wherein an area ratio of $A_H:A_D$ is in a range of 3:1 to 10:1.

6. The power stage assembly of claim 1, wherein the thermal pads of the embedded die packages have an area $A_D$ and the thermal pads of the heat-spreader have an area $A_H$, and wherein an area ratio of $A_H:A_D$ is greater than 5:1.

7. The power stage assembly of claim 1, configured for a half-bridge switch topology, wherein:
the embedded die packages are arranged to provide a high-side switch comprising one power switching device or a plurality of power switching devices electrically connected in parallel and a low-side switch comprising one power switching device or a plurality of power switching devices electrically connected in parallel, and
said thermal pads of the fifth layer of the heat-spreader comprise a first thermal pad for the low-side switch and a second thermal pad for the high-side switch, and wherein the first thermal pad is interconnected through the fourth layer to the EMC shielding layer.

8. The power stage assembly of claim 1, configured for a full-bridge switch topology, wherein:
the embedded die packages are arranged to provide a high-side switch comprising one power switching device or a plurality of power switching devices electrically connected in parallel and a low-side switch comprising one power switching device or a plurality of power switching devices electrically connected in parallel, and said thermal pads of the fifth layer of the heat-spreader comprise a first thermal pads for each for the low-side switch and second thermal pads for each of the high-side switch, and wherein the first thermal pads are interconnected through the fourth layer to the EMC shielding layer.

9. The power stage assembly of claim 1, configured for a full-bridge switch topology, wherein:
the embedded die packages are arranged to provide a high-side switch comprising one power switching device or a plurality of power switching devices electrically connected in parallel and a low-side switch comprising one power switching device or a plurality of power switching devices electrically connected in parallel, and
said thermal pads of the fifth layer of the heat-spreader comprise a first thermal pad for the low-side switch and second thermal pad for the high-side switch.

10. A heat-spreader for a power stage assembly configured for a half-bridge switch module, wherein a plurality of embedded die packages are arranged to provide a high-side switch comprising one power switching device or a plurality of power switching devices electrically connected in parallel and a low-side switch comprising one power switching device or a plurality of power switching devices electrically connected in parallel,
the heat-spreader comprising a multilayer insulated metal substrate (IMS) structure comprising:
a first layer comprising a thermally conductive metal substrate layer;
a second layer comprising a thermally conductive dielectric layer;
a third layer comprising an electrically conductive and thermally conductive material defining an electromagnetic compatibility (EMC) shielding layer;

a fourth layer comprising a thermally conductive dielectric layer;

a fifth layer comprising an electrically conductive and thermally conductive material defining thermal pads in thermal contact with thermal pads of each die package;

the dielectric layers providing electrical isolation between said conductive layers; and the EMC shielding layer being interconnected to power ground;

the thermal pads of the fifth layer having an area larger than an area of the thermal pad of each embedded die package to provide lateral heat-spreading; said thermal pads of the fifth layer of the heat-spreader comprising a first thermal pad for the low-side switch and a second thermal pad for the high-side switch, and wherein the first thermal pad is interconnected through the fourth layer to the EMC shielding layer.

11. A power stage assembly for top-cooled semiconductor power switching devices comprising:

a PCB substrate a plurality of embedded die packages, each embedded die package comprising a semiconductor power switching device comprising at least one power transistor, having electrical contact areas on a bottom-side of the die package and a thermal pad on a top-side of the die package;

the plurality of embedded die packages being mounted on the PCB substrate with electrical connections between conductive traces of the PCB substrate and the electrical contact areas on the back-side of each die package;

a heat-spreader in thermal contact with the thermal pads on the back-sides of each of each die package;

the heat-spreader being secured to the PCB substrate; and a heatsink in thermal contact with the heat-spreader;

wherein the heat-spreader is a multilayer structure comprising:

a first layer comprising a thermally conductive metal substrate layer in contact with the heatsink;

a second layer comprising a thermally conductive dielectric layer;

a third layer comprising an electrically conductive and thermally conductive material defining thermal pads in contact with thermal pads of each die package;

the dielectric layer providing electrical isolation between the first and second layers of the heat-spreader;

the thermal pads of the third layer having an area larger than an area of the thermal pad of each embedded die package to provide lateral heat-spreading.

12. The power stage assembly of claim 11, wherein said layers of the heat-spreader are provided by a multi-layer insulated metal substrate.

13. The power stage assembly of claim 11, wherein the top-cooled power switching devices are GaN power switching devices.

14. The power stage assembly of claim 11, configured for a half-bridge switch topology, a full-bridge switch topology, or other switch topology comprising a plurality of power switching devices.

15. The power stage assembly of claim 11, wherein the thermal pads of the embedded die packages have an area $A_D$ and the thermal pads of the heat-spreader have an area $A_H$, and wherein an area ratio of $A_H:A_D$ is in a range of 3:1 to 10:1.

16. The power stage assembly of claim 11, wherein the thermal pads of the embedded die packages have an area $A_D$ and the thermal pads of the heat-spreader have an area $A_H$, and wherein an area ratio of $A_H:A_D$ is greater than 5:1.

17. The power stage assembly of claim 11, configured for a half-bridge switch topology, wherein:

the embedded die packages are arranged to provide a high-side switch comprising one power switching device or a plurality of power switching devices electrically connected in parallel and a low-side switch comprising one power switching device or a plurality of power switching devices electrically connected in parallel, and said thermal pads of the fifth layer of the heat-spreader comprise a first thermal pad for the low-side switch and a second thermal pad for the high-side switch.

* * * * *